United States Patent
Lee et al.

(10) Patent No.: US 8,094,024 B2
(45) Date of Patent: Jan. 10, 2012

(54) AMPLITUDE SHIFT KEYING DEMODULATOR AND RADIO FREQUENCY IDENTIFICATION SYSTEM USING THE SAME

(75) Inventors: Yuan-Jiang Lee, Hsin-Chu (TW); Yueh-Hua Yu, Hsin-Chu (TW); Yi-Jan Chen, Hsin-Chu (TW); Yu-Hsuan Li, Hsin-Chu (TW)

(73) Assignee: Au Optronics Corp., Hsin-Chu (TW)

( * ) Notice: Subject to any disclaimer, the term of this patent is extended or adjusted under 35 U.S.C. 154(b) by 384 days.

(21) Appl. No.: 12/500,790

(22) Filed: Jul. 10, 2009

(65) Prior Publication Data
US 2010/0164724 A1 Jul. 1, 2010

(30) Foreign Application Priority Data
Dec. 29, 2008 (TW) ............... 97151297 A

(51) Int. Cl.
*G08B 13/14* (2006.01)
*H03D 1/18* (2006.01)
(52) U.S. Cl. ............... 340/572.1; 340/572.4; 340/13.37; 329/317

(58) Field of Classification Search ............... 340/572.1, 340/572.4, 539.1, 5.1, 10.1, 13.1, 13.2, 13.37, 340/14.62, 14.63, 14.64, 14.65; 329/369, 329/317, 347; 257/377, 773–726; 375/268, 375/269; 438/238, 129, 128, 800
See application file for complete search history.

(56) References Cited

U.S. PATENT DOCUMENTS

| | | | |
|---|---|---|---|
| 4,276,617 A * | 6/1981 | Le | 365/94 |
| 6,097,103 A * | 8/2000 | Ishigaki | 257/776 |
| 6,242,297 B1 * | 6/2001 | Ishigaki | 438/238 |
| 7,003,680 B2 * | 2/2006 | Masui et al. | 713/300 |

* cited by examiner

*Primary Examiner* — Toan N Pham
(74) *Attorney, Agent, or Firm* — Chun-Ming Shih

(57) ABSTRACT

An exemplary amplitude shift keying (ASM) demodulator and a radio frequency identification (RFID) system using the same are provided. The ASM demodulator is adapted to demodulate an alternating current input signal and generate a demodulated envelope signal. The ASM demodulator includes a signal input terminal group, an input rectifier circuit, a current mirror circuit electrically coupled to the input rectifier circuit, an output stage electrically coupled to the current mirror circuit, and a low pass filter electrically coupled to the output stage. The input rectifier circuit is electrically coupled to the signal input terminal group and adapted to perform a rectifying operation applied to the alternating current input signal. The input rectifier circuit includes a plurality of electrically coupled transistors and a gate electrode of each of the transistors is unconnected with a source electrode and a drain electrode itself.

13 Claims, 2 Drawing Sheets

US 8,094,024 B2

AMPLITUDE SHIFT KEYING DEMODULATOR AND RADIO FREQUENCY IDENTIFICATION SYSTEM USING THE SAME

CROSS-REFERENCE TO RELATED APPLICATIONS

This application is based upon and claims the benefit of priority from the prior Taiwanese Patent Application No. 097151297, filed Dec. 29, 2008, the entire contents of which are incorporated herein by reference.

BACKGROUND

1. Technical Field

The present invention generally relates to the wireless communication field and, particularly to an amplitude shift keying (ASK) demodulator and a radio frequency identification (RFID) system using the same.

2. Description of the Related Art

With the rapid developments of the requirement for wireless communication as well as broadband wireless networks, radio frequency identification systems have become a very hot topic in recent years. The radio frequency identification systems aim at shortcomings of traditional contact systems and transmit digital data using radio waves, so that transponders thereof can interchange data with readers without the need of direct contact. As a result, the device wear and tear caused by direct contact is avoided and the convenience for use is improved. Furthermore, if the radio frequency identification systems can be combined with the current display industry and directly integrated into display devices, applications thereof would become more popular and widespread.

Therefore, in one aspect, how to design a demodulator adapted to receive low-amplitude input signals and thus suitable for wireless related systems (e.g., radio frequency identification systems) working with low-amplitude input signals; in another aspect, how to design a radio frequency identification system which is suitable for being incorporated into a display device manufactured by a high threshold voltage process of low temperature poly-silicon (LTPS); both of the above-mentioned aspects are problems needed to be urgently solved at present.

BRIEF SUMMARY

The present invention relates to an amplitude shift keying demodulator adapted to receive a low-amplitude input signal and thus suitable for wireless related systems working with low-amplitude input signals.

The present invention further relates to a radio frequency identification system suitable for being incorporated into a display device.

In order to achieve the above-mentioned advantages, an amplitude shift keying demodulator in accordance with an embodiment of the present invention is provided. The amplitude shift keying demodulator is adapted to demodulate an alternating current input signal and generate a demodulated envelope signal. The amplitude shift keying demodulator includes a signal input terminal group, an input rectifier circuit, a current mirror circuit, an output stage and a low pass filter. The signal input terminal group is adapted to receive the alternating current input signal and includes a first input terminal and a second input terminal. The input rectifier circuit is electrically coupled to the signal input terminal group and adapted to perform a full-wave rectifying operation applied to the alternating current input signal. The input rectifier circuit includes a plurality of electrically coupled transistors. A gate electrode of each of the transistors is unconnected with a source electrode and a drain electrode itself. The current mirror circuit is electrically coupled to the input rectifier circuit and adapted to generate a mirror current according to an input current from the input rectifier circuit. The output stage is electrically coupled to the current mirror circuit to receive the mirror current and adapted to generate an output current according to the mirror current. The low pass filter is electrically coupled to the output stage to receive the output current and adapted to perform a low pass filtering operation applied to the output current to generate the demodulated envelope signal.

In one embodiment, the transistors of the input rectifier circuit include a first N-type transistor, a second N-type transistor, a first P-type transistor and a second P-type transistor. The first N-type transistor has a gate electrode, a first source/drain electrode and a second source/drain electrode. The gate electrode of the first N-type transistor is adapted to receive a first control voltage, and the first source/drain electrode of the first N-type transistor is electrically coupled to the first input terminal. The second N-type transistor has a gate electrode, a first source/drain electrode and a second source/drain electrode. The gate electrode of the second N-type transistor is adapted to receive the first control voltage, and the first source/drain electrode of the second N-type transistor is electrically coupled to the second input terminal. The first P-type transistor has a gate electrode, a first source/drain electrode and a second source/drain electrode. The gate electrode of the first P-type transistor is adapted to receive a second control voltage, and the first source/drain electrode of the first P-type transistor is electrically coupled to the first input terminal. The second P-type transistor has a gate electrode, a first source/drain electrode and a second source/drain electrode. The gate electrode of the second P-type transistor is adapted to receive the second control voltage, and the first source/drain electrode of the second P-type transistor is electrically coupled to the second input terminal.

In one embodiment, the amplitude shift keying demodulator further includes a bias circuit. The bias circuit includes a first current source, a third N-type transistor, a second current source and a third P-type transistor. A terminal of the first current source is electrically coupled to a first supply voltage and another terminal of the first current source is electrically coupled to the gate electrode of the first N-type transistor. The third N-type transistor has a gate electrode, a first source/drain electrode and a second source/drain electrode. The gate electrode and the second source/drain electrode of the third N-type transistor both are electrically coupled to the gate electrode of the first N-type transistor, and the first source/drain electrode of the third N-type transistor is electrically coupled to a first bias voltage. A terminal of the second current source is electrically coupled to a second supply voltage, and another terminal of the second current source is electrically coupled to the gate electrode of the first P-type transistor. The third P-type transistor has a gate electrode, a first source/drain electrode and a second source/drain electrode. The gate electrode and the second source/drain electrode of the third P-type transistor both are electrically coupled to the gate electrode of the first P-type transistor, and the first source/drain electrode of the third P-type transistor is electrically coupled to the first bias voltage.

In one embodiment, the current mirror circuit includes a fourth P-type transistor, a fourth N-type transistor, a fifth P-type transistor and a fifth N-type transistor. The fourth P-type transistor has a gate electrode, a first source/drain electrode and a second source/drain electrode. The gate electrode and the second source/drain electrode of the fourth P-type transistor both are electrically coupled to the second source/drain electrodes of the first and second N-type transistors, and the first source/drain source of the fourth P-type transistor is electrically coupled to a first supply voltage. The fourth N-type transistor has a gate electrode, a first source/drain electrode and a second source/drain electrode. The gate electrode and the second source/drain electrode of the fourth N-type transistor both are electrically coupled to the second source/drain electrode of the first and second P-type transistor, and the first source/drain electrode of the fourth N-type transistor is electrically coupled to a second supply voltage. The fifth P-type transistor has a gate electrode, a first source/drain electrode and a second source/drain electrode. The gate electrode of the fifth P-type transistor is electrically coupled to the gate electrode of the fourth P-type transistor, the first source/drain electrode of the fifth P-type transistor is electrically coupled to the first supply voltage, and the second source/drain electrode of the fifth P-type transistor is electrically coupled to the output stage to provide the mirror current. The fifth N-type transistor has a gate electrode, a first source/drain electrode and a second source/drain electrode. The gate electrode of the fifth N-type transistor is electrically coupled to the gate electrode of the fourth N-type transistor, the first source/drain electrode of the fifth N-type transistor is electrically coupled to the second supply voltage, and the second source/drain electrode of the fifth N-type transistor is electrically coupled to the output stage.

In one embodiment, the output stage includes a sixth P-type transistor, a seventh P-type transistor, a eighth P-type transistor and a ninth P-type transistor. The sixth P-type transistor has a gate electrode, a first source/drain electrode and a second source/drain electrode. The first source/drain electrode of the sixth P-type transistor is electrically coupled to the first supply voltage. The seventh P-type transistor has a gate electrode, a first source/drain electrode and a second source/drain electrode. The first source/drain electrode of the seventh P-type transistor is electrically coupled to the first supply voltage, the gate electrode of the seventh P-type transistor is electrically coupled to the gate electrode of the sixth P-type transistor, and the second source/drain electrode of the seventh P-type transistor is electrically coupled to the second source/drain electrode of the fifth P-type transistor. The eighth P-type transistor has a gate electrode, a first source/drain electrode and a second source/drain electrode. The gate electrode of the eighth P-type transistor is electrically coupled to a second bias voltage, the first source/drain electrode of the eighth P-type transistor is electrically coupled to the second source/drain electrode of the sixth P-type electrode, and the second source/drain electrode of the eighth P-type transistor is electrically coupled to both of the gate electrode of the sixth P-type transistor and the second source/drain electrode of the fifth N-type transistor. The ninth P-type transistor has a gate electrode, a first source/drain electrode and a second source/drain electrode. The gate electrode of the ninth P-type transistor is electrically coupled to the second bias voltage, the first source/drain electrode of the ninth P-type transistor is electrically coupled to the second source/drain electrode of the seventh P-type transistor, and the second source/drain electrode of the ninth P-type transistor is electrically coupled to the low pass filter to provide the output current.

A radio frequency identification system in accordance with another embodiment of the present invention is provided. The radio frequency identification system includes a wireless receiving module, the above-mentioned amplitude shift keying demodulator and a processing module. The wireless receiving module is adapted to receive a wireless radio frequency signal and transform the received wireless radio frequency signal into an alternating current input signal. The amplitude shift keying demodulator is electrically coupled to the wireless receiving module to receive the alternating current input signal and adapted to generate a demodulated envelope signal. The processing module is electrically coupled to the amplitude shift keying demodulator to receive the demodulated envelope signal and adapted to perform a corresponding operation according to the demodulated envelope signal.

In one embodiment, the radio frequency identification system further includes a display module, the display module is adapted to display the content contained in the demodulated envelope signal under the control of the processing module.

In the above-mentioned embodiments of the present invention, the input rectifier circuit of the amplitude shift keying demodulator utilizes a plurality of electrically coupled transistors to perform a rectifying operation and the gate electrode of each of the transistors is unconnected with the source electrode and the drain electrode itself, therefore a diode architecture is unnecessary to be used for performing the rectifying operation and thus a voltage drop caused by diode can be avoided. Accordingly, the present amplitude shift keying demodulator is adapted to receive low-amplitude input signals and thus suitable for wireless related systems (e.g., radio frequency identification systems) working with low-amplitude input signals. In addition, since the input rectifier circuit can perform a full-wave rectifying operation, the outputted demodulated envelope signal would have low ripple issue. Furthermore, since the present amplitude shift keying demodulator can avoid the diode voltage drop, in a low temperature poly-silicon manufacture process, such circuit can achieve some advantages and thus an attenuation caused by the diode voltage drop to the input signal can be avoided. As a result, the radio frequency identification system using the present amplitude shift keying demodulator can be incorporated into a display device using the high threshold voltage manufacture process of low temperature poly-silicon.

BRIEF DESCRIPTION OF THE DRAWINGS

These and other features and advantages of the various embodiments disclosed herein will be better understood with respect to the following description and drawings, in which like numbers refer to like parts throughout, and in which.

DETAILED DESCRIPTION

Figure 1:
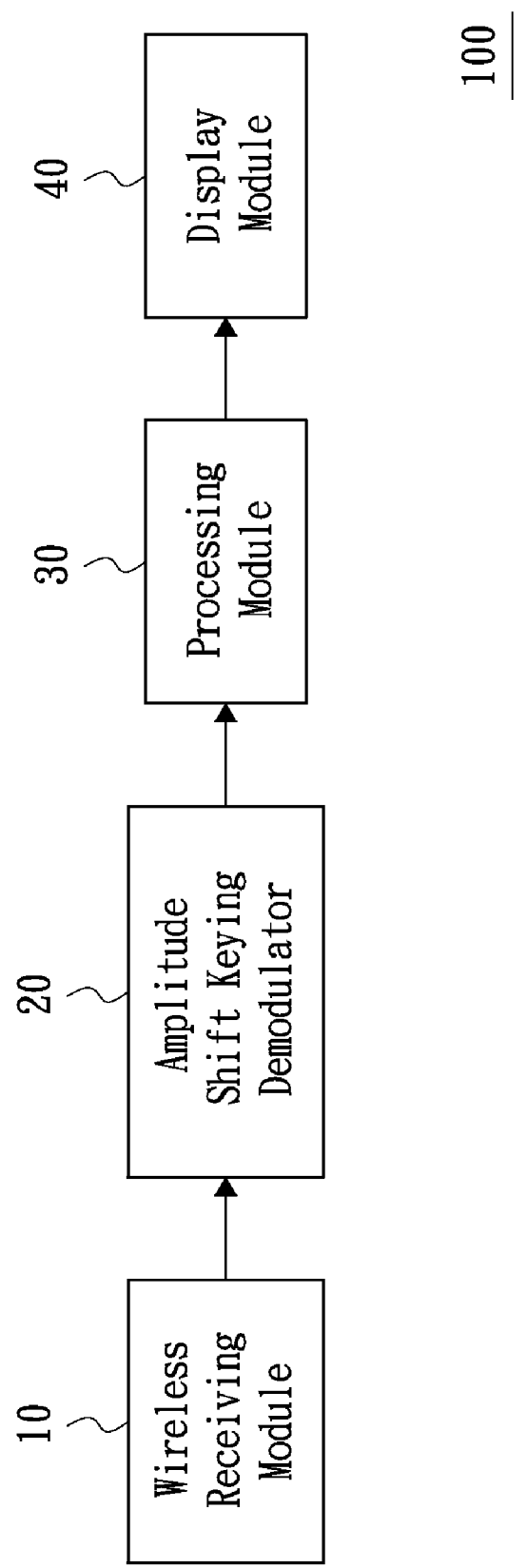
FIG. 1 illustrates a structural block diagram of a radio frequency identification system in accordance with an embodiment of the present invention.
Figure 2:
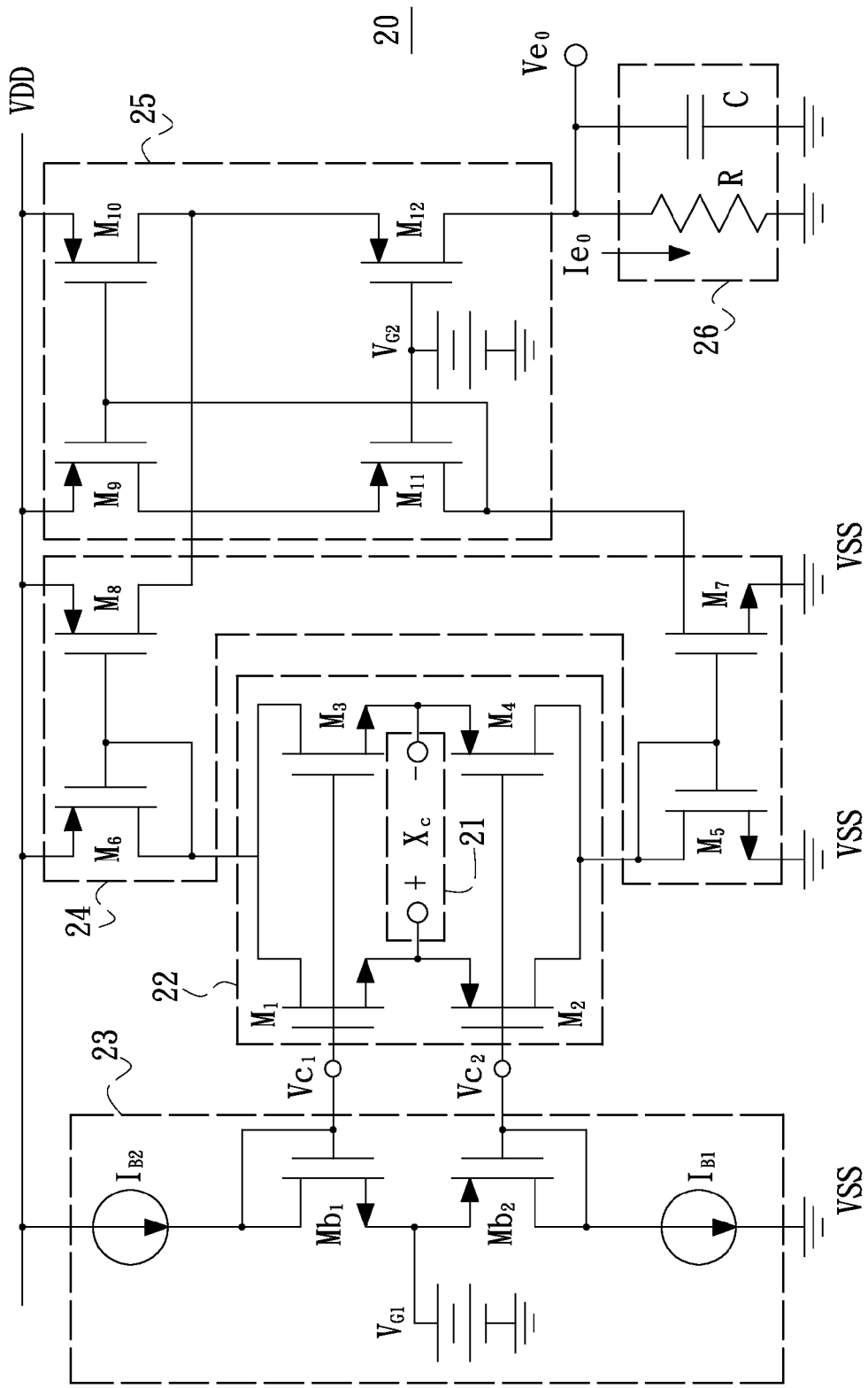
FIG. 2 illustrates a circuit diagram of an amplitude shift keying demodulator in accordance with an embodiment of the present invention.

Referring to FIGS. 1 and 2, a radio frequency identification (RFID) system 100 in accordance with an embodiment of the present invention is provided. The radio frequency identification system 100 includes a wireless receiving module 10, an amplitude shift keying (ASK) demodulator 20, a processing module 30 and a display module 40. The wireless receiving module 10 is adapted to receive a wireless radio frequency signal (not shown) and transform the received wireless radio frequency signal into a corresponding alternating current input signal Xc (as denoted in FIG. 2). The amplitude shift keying demodulator 20 is electrically coupled to the wireless receiving module 10 to receive the alternating current input signal Xc and adapted to demodulate the received alternating current input signal Xc so as to generate a demodulated envelope signal Ve0 (as denoted in FIG. 2). The processing module 30 is electrically coupled to the amplitude shift keying demodulator 20 to receive the demodulated envelope signal and adapted to perform a corresponding operation according the demodulated envelope signal Ve0. The display module 40 is adapted to display the content contained in the demodulated envelope signal Ve0 under the control of the processing module 30.

A circuit structural configuration of the amplitude shift keying demodulator 20 will be described below in detail with reference to FIG. 2. As illustrated in FIG. 2, the amplitude shift keying demodulator 20 includes a signal input terminal group 21, an input rectifier circuit 22, a bias circuit 23, a current mirror circuit 24, an output stage 25 and a low pass filter 26.

The signal input terminal group 21 includes a positive input terminal (+) and a negative input terminal (−). The signal input terminal group 21 is adapted to receive the alternating current input signal Xc.

The input rectifier circuit 22 includes a plurality of electrically coupled transistors and each of the transistors is configured in the input rectifier circuit 22 with a manner of the gate electrode is unconnected with the source electrode and the drain electrode itself. The input rectifier circuit 22 is adapted to generate an input current (not shown) according to the alternating current input signal Xc inputted from the signal input terminal group 21 and direct the input current to the current mirror circuit 24. In particular, in the present embodiment, the input rectifier circuit 22 includes N-type transistors M1, M3 and P-type transistors M2, M4. The N-type transistor M1 has a gate electrode, a source electrode and a drain electrode. The gate electrode of the N-type transistor M1 is adapted to receive a control voltage Vc1, and the source electrode of the N-type transistor M1 is electrically coupled to the positive input terminal (+) of the signal input terminal group 21. The N-type transistor M3 has a gate electrode, a source electrode and a drain electrode. The gate electrode of the N-type transistor M3 is adapted to receive the control voltage Vc1, and the source electrode of the N-type transistor M3 is electrically coupled to the negative input terminal (−) of the signal input terminal group 21. The P-type transistor M2 has a gate electrode, a source electrode and a drain electrode. The gate electrode of the P-type transistor M2 is adapted to receive a control voltage Vc2, and the source electrode of the P-type transistor M2 is electrically coupled to the positive input terminal (+) of the signal input terminal group 21. The P-type transistor M4 has a gate electrode, a source electrode and a drain electrode. The gate electrode of the P-type transistor M4 is adapted to receive the control voltage Vc2, and the source electrode of the P-type transistor M4 is electrically coupled to the negative input terminal (−) of the signal input terminal group 21.

The bias circuit 23 is for supplying the control voltages Vc1, Vc2 to the input rectifier circuit 22. More specifically, in the present embodiment, the bias circuit 23 includes a current source $I_{B2}$, an N-type transistor Mb1, another current source $I_{B1}$ and a P-type transistor Mb2. A terminal of the current source $I_{B2}$ is electrically coupled to a supply voltage VDD, and another terminal of the current source $I_{B2}$ is electrically coupled to the gate electrode of the N-type transistor M1. The N-type transistor Mb1 has a gate electrode, a source electrode and a drain electrode. The N-type transistor Mb1 is configured in the bias circuit 23 with a diode-connected manner (i.e., the gate electrode is coupled with one of the source electrode and the drain electrode). The gate electrode and drain electrode of the N-type transistor Mb1 both are electrically coupled to the gate electrode of the N-type transistor M1, and the source electrode of the N-type transistor Mb1 is electrically coupled to a bias voltage $V_{G1}$. A terminal of the current source $I_{B1}$ is electrically coupled to a supply voltage VSS, and another terminal of the current source $I_{B1}$ is electrically coupled to the gate electrode of the P-type transistor M2. The P-type transistor Mb2 has a gate electrode, a source electrode and a drain electrode. The P-type transistor Mb2 is configured in the bias circuit 23 with the diode-connected manner. The gate electrode and drain electrode of the P-type transistor Mb2 both are electrically coupled to the gate electrode of the P-type transistor M2, and the source electrode of the P-type transistor Mb2 is electrically coupled to the bias voltage $V_{G1}$.

The current mirror circuit 24 is electrically coupled to the input rectifier circuit 22 and adapted to generate a mirror current (not shown) according to the input current from the input rectifier circuit 22. In particular, in the present embodiment, the current mirror circuit 24 includes a P-type transistor M6, an N-type transistor M5, another P-type transistor M8 and another N-type transistor M7. The P-type transistor M6 has a gate electrode, a source electrode and a drain electrode. The gate electrode and drain electrode of the P-type transistor M6 both are electrically coupled to the drain electrodes of the N-type transistors M1, M3, and the source electrode of the P-type transistor M6 is electrically coupled to the supply voltage VDD. The N-type transistor M5 has a gate electrode, a source electrode and a drain electrode. The gate electrode and drain electrode of the N-type transistor M5 both are electrically coupled to the drain electrodes of the P-type transistors M2, M4, and the source electrode of the N-type transistor M5 is electrically coupled to the supply voltage VSS. The P-type transistor M8 has a gate electrode, a source electrode and a drain electrode. The gate electrode of the P-type transistor M8 is electrically coupled to the gate electrode of the P-type transistor M6, the source electrode of the P-type transistor M8 is electrically coupled to the supply voltage VDD, and the drain electrode of the P-type transistor M8 is electrically coupled to the output stage 25 to provide the mirror current. The N-type transistor M7 has a gate electrode, a source electrode and a drain electrode. The gate electrode of the N-type transistor M7 is electrically coupled to the gate electrode of the N-type transistor M5, the source electrode of the N-type transistor M7 is electrically coupled to the supply voltage VSS, and the drain electrode of the N-type transistor M7 is electrically coupled to the output stage 25.

The output stage 25 is electrically coupled to the current mirror circuit 24 to receive the mirror current and adapted to generate an output current Ie0 according to the received mirror current. Specifically, in the present embodiment, the output stage 25 includes P-type transistors M9, M10, M11 and M12. The P-type transistor M9 has a gate electrode, a source and a drain electrode. The source electrode of the P-type transistor M9 is electrically coupled to the supply voltage VDD. The P-type transistor M10 has a gate electrode, a source electrode and a drain electrode. The source electrode of the P-type transistor M10 is electrically coupled to the supply voltage VDD, the gate electrode of the P-type transistor M10 is electrically coupled to the gate electrode of the P-type transistor M9, and the drain electrode of the P-type transistor M10 is electrically coupled to the drain electrode of the P-type transistor M8. The P-type transistor M11 has a gate electrode, a source electrode and a drain electrode. The gate electrode of the P-type transistor M11 is electrically coupled to a bias voltage $V_{G2}$, the source electrode of the P-type transistor M11 is electrically coupled to the drain electrode of the P-type transistor M9, and the drain electrode of the P-type transistor M11 is electrically coupled to both of the gate electrode of the P-type transistor M9 and the drain electrode of the N-type transistor M7. The P-type transistor M12 has a gate electrode, a source electrode and a drain electrode. The gate electrode of the P-type transistor M12 is electrically coupled to the bias voltage $V_{G2}$, the source electrode of the P-type transistor M12 is electrically coupled to the drain electrode of the P-type transistor M10, and the drain electrode of the P-type transistor M12 is electrically coupled to the low pass filter 26 to provide the output current Ie0.

The low pass filter 26 is electrically coupled to the output stage 25 to receive the output current Ie0 and adapted to perform a low pass filtering operation applied to the output current Ie0 to generate the demodulated envelope signal Ve0. In the present embodiment, the low pass filter 26 includes a resistor R and a capacitor C electrically coupled with each other in parallel.

In summary, in regard to the amplitude shift keying demodulator of the above-mentioned embodiment, the input rectifier circuit 22 uses a plurality of electrically coupled transistors to perform a rectifying operation and the gate electrode of each of the transistors is unconnected with the source and drain electrodes itself, therefore a diode architecture is unnecessary to be used for performing the rectifying operation and thus a voltage drop caused by diode can be avoided. Accordingly, the amplitude shift keying demodulator 20 in accordance with the above-mentioned embodiment is adapted to receive a low-amplitude input signal and thus suitable for wireless related systems (e.g., radio frequency identification systems) working with low-amplitude input signals. Furthermore, since the input rectifier circuit 22 can perform a full-wave rectifying operation, the outputted demodulated envelope signal would have low ripple issue. In addition, the solution of using the bias circuit 23 to regulate the control voltages for the electrically coupled transistors of the input rectifier circuit 22 can compensate an influence of threshold voltage shift under process variation. Further, since the amplitude shift keying demodulator in accordance with the present embodiment can avoid the influence of diode voltage drop, in a low temperature poly-silicon manufacture process, such circuit can achieve some advantages and thus an attenuation of input signal caused by the diode voltage drop can be avoided. As a result, the radio frequency identification system using the present amplitude shift keying demodulator can be incorporated into a display device using the high threshold voltage manufacture process of low temperature poly-silicon.

It is indicated that, the connections of the source electrode and drain electrode of each of the N-type and P-type transistors can be interchanged according to the requirements of different circuit designs; it still can achieve the effect of the present invention. In addition, the skilled person in the art also can make suitable change(s) applied to the input rectifier circuit 22, the bias circuit 23, the current mirror circuit 24, the output stage 25 and/or the low pass filter 26, as long as such change(s) would not depart from the scope and spirit of the present invention.

The above description is given by way of example, and not limitation. Given the above disclosure, one skilled in the art could devise variations that are within the scope and spirit of the invention disclosed herein, including configurations ways of the recessed portions and materials and/or designs of the attaching structures. Further, the various features of the embodiments disclosed herein can be used alone, or in varying combinations with each other and are not intended to be limited to the specific combination described herein. Thus, the scope of the claims is not to be limited by the illustrated embodiments.

What is claimed is:

1. An amplitude shift keying demodulator adapted to demodulate an alternating current input signal and generate a demodulated envelope signal, the amplitude shift keying demodulator comprising:
    a signal input terminal group comprising a first input terminal and a second input terminal, the signal input terminal group adapted to receive the alternating current input signal;
    an input rectifier circuit comprising:
        a first N-type transistor having a gate electrode, a first source/drain electrode and a second source/drain electrode, wherein the gate electrode of the first N-type transistor is adapted to receive a first control voltage, and the first source/drain electrode of the first N-type transistor is electrically coupled to the first input terminal;
        a second N-type transistor having a gate electrode, a first source/drain electrode and a second source/drain electrode, wherein the gate electrode of the second N-type transistor is adapted to receive the first control voltage, and the first source/drain electrode of the second N-type transistor is electrically coupled to the second input terminal;
        a first P-type transistor having a gate electrode, a first source/drain electrode and a second source/drain electrode, wherein the gate electrode of the first P-type transistor is adapted to receive a second control voltage, and the first source/drain electrode of the first P-type transistor is electrically coupled to the first input terminal; and
        a second P-type transistor having a gate electrode, a first source/drain electrode and a second source/drain electrode, wherein the gate electrode of the second P-type transistor is adapted to receive the second control voltage, and the first source/drain electrode of the second P-type transistor is electrically coupled to the second input terminal;
    a current mirror circuit electrically coupled to the input rectifier circuit and adapted to generate a mirror current according to an input current from the input rectifier circuit;
    an output stage electrically coupled to the current mirror circuit to receive the mirror current and adapted to generate an output current according to the mirror current; and
    a low pass filter electrically coupled to the output stage to receive the output current and adapted to perform a low pass filtering operation applied to the output current to generate the demodulated envelope signal.

2. The amplitude shift keying demodulator as claimed in claim 1, further comprising a bias circuit, the bias circuit comprising:
    a first current source, wherein a terminal of the first current source is electrically coupled to a first supply voltage, and another terminal of the first current source is electrically coupled to the gate electrode of the first N-type transistor;
    a third N-type transistor having a gate electrode, a first source/drain electrode and a second source/drain electrode, wherein the gate electrode and the second source/drain electrode of the third N-type transistor both are electrically coupled to the gate electrode of the first N-type transistor, and the first source/drain electrode of the third N-type transistor is electrically coupled to a first bias voltage;

a second current source, wherein a terminal of the second current source is electrically coupled to a second supply voltage, and another terminal of the second current source is electrically coupled to the gate electrode of the first P-type transistor; and a third P-type transistor having a gate electrode, a first source/drain electrode and a second source/drain electrode, wherein the gate electrode and the second source/drain electrode of the third P-type transistor both are electrically coupled to the gate electrode of the first P-type transistor, and the first source/drain electrode of the third P-type transistor is electrically coupled to the first bias voltage.

3. The amplitude shift keying demodulator as claimed in claim 1, wherein the current mirror circuit comprises:

a fourth P-type transistor having a gate electrode, a first source/drain electrode and a second source/drain electrode, wherein the gate electrode and the second source/drain electrode of the fourth P-type transistor both are electrically coupled to the second source/drain electrodes of the first and second N-type transistors, and the first source/drain electrode of the fourth P-type transistor is electrically coupled to a first supply voltage;

a fourth N-type transistor having a gate electrode, a first source/drain electrode and a second source/drain electrode, wherein the gate electrode and the second source/drain electrode of the fourth N-type transistor both are electrically coupled to the second source/drain electrodes of the first and second P-type transistors, and the first source/drain electrode of the fourth N-type transistor is electrically coupled to a second supply voltage;

a fifth P-type transistor having a gate electrode, a first source/drain electrode and a second source/drain electrode, wherein the gate electrode of the fifth P-type transistor is electrically coupled to the gate electrode of the fourth P-type transistor, the first source/drain electrode of the fifth P-type transistor is electrically coupled to the first supply voltage, and the second source/drain electrode of the fifth P-type transistor is electrically coupled to the output stage to provide the mirror current; and a fifth N-type transistor having a gate electrode, a first source/drain electrode and a second source/drain electrode, wherein the gate electrode of the fifth N-type electrode is electrically coupled to the gate electrode of the fourth N-type transistor, the first source/drain electrode of the fifth N-type transistor is electrically coupled to the second supply voltage, and the second source/drain electrode of the fifth N-type transistor is electrically coupled to the output stage.

4. The amplitude shift keying demodulator as claimed in claim 3, wherein the output stage comprises:

a sixth P-type transistor having a gate electrode, a first source/drain electrode and a second source/drain electrode, wherein the first source/drain electrode of the sixth P-type transistor is electrically coupled to the first supply voltage;

a seventh P-type transistor having a gate electrode, a first source/drain electrode and a second source/drain electrode, wherein the first source/drain electrode of the seventh P-type transistor is electrically coupled to the first supply voltage, the gate electrode of the seventh P-type transistor is electrically coupled to the gate electrode of the sixth P-type transistor, and the second source/drain electrode of the seventh P-type transistor is electrically coupled to the second source/drain electrode of the fifth P-type transistor;

a eighth P-type transistor having a gate electrode, a first source/drain electrode and a second source/drain electrode, wherein the gate electrode of the eighth P-type transistor is electrically coupled to a second bias voltage, the first source/drain electrode of the eighth P-type transistor is electrically coupled to the second source/drain electrode of the sixth P-type transistor, and the second source/drain electrode of the eighth P-type transistor is electrically coupled to both of the gate electrode of the sixth P-type transistor and the second source/drain electrode of the fifth N-type transistor; and a ninth P-type transistor having a gate electrode, a first source/drain electrode and a second source/drain electrode, wherein the gate electrode of the ninth P-type transistor is electrically coupled to the second bias voltage, the first source/drain electrode of the ninth P-type transistor is electrically coupled to the second source/drain electrode of the seventh P-type transistor, and the second source/drain electrode of the ninth P-type transistor is electrically coupled to the low pass filter to provide the output current.

5. A radio frequency identification system using the amplitude shift keying demodulator as claimed in claim 1, comprising:

a wireless receiving module, adapted to receive a wireless radio frequency signal and transform the received wireless radio frequency signal into an alternating current input signal;

the amplitude shift keying demodulator as claimed in claim 1, electrically coupled to the wireless receiving module to receive the alternating current input signal; and a processing module, electrically coupled to the amplitude shift keying demodulator to receive the demodulated envelope signal and adapted to perform a corresponding operation according to the demodulated envelope signal.

6. The radio frequency identification demodulator as claimed in claim 5, further comprising a display module, wherein the display module is adapted to display the content contained in the demodulated envelope signal under the control of the processing module.

7. An amplitude shift keying demodulator adapted to demodulate an alternating current input signal and generate a demodulated envelope signal, the amplitude shift keying demodulator comprising:

a signal input terminal group comprising a first input terminal and a second input terminal, the signal input terminal group adapted to receive the alternating current input signal;

an input rectifier circuit electrically coupled to the signal input terminal group and adapted to perform a full-wave rectifying operation applied to the alternating current input signal, wherein the input rectifier circuit comprises a plurality of electrically coupled transistors and a gate electrode of each of the transistors is unconnected with a first source/drain electrode and a second source/drain electrode itself;

a current mirror circuit electrically coupled to the input rectifier circuit and adapted to generate a mirror current according to an input current from the input rectifier circuit;

an output stage electrically coupled to the current mirror circuit to receive the mirror current and adapted to generate an output current according to the mirror current; and a low pass filter electrically coupled to the output stage to receive the output current and adapted to perform a low pass filtering operation applied to the output current to output the demodulated envelope signal.

8. The amplitude shift keying demodulator as claimed in claim 7, wherein the transistors of the input rectifier circuit comprise:
a first N-type transistor having a gate electrode, a first source/drain electrode and a second source/drain electrode, wherein the gate electrode of the first N-type transistor is adapted to receive a first control voltage, and the first source/drain electrode of the first N-type transistor is electrically coupled to the first input terminal;
a second N-type transistor having a gate electrode, a first source/drain electrode and a second source/drain electrode, wherein the gate electrode of the second N-type transistor is adapted to receive the first control voltage, and the first source/drain electrode of the second N-type transistor is electrically coupled to the second input terminal;
a first P-type transistor having a gate electrode, a first source/drain electrode and a second source/drain electrode, wherein the gate electrode of the first P-type transistor is adapted to receive a second control voltage, and the first source/drain electrode of the first P-type transistor is electrically coupled to the first input terminal; and
a second P-type transistor having a gate electrode, a first source/drain electrode and a second source/drain electrode, wherein the gate electrode of the second P-type transistor is adapted to receive the second control voltage, and the first source/drain electrode of the second P-type transistor is electrically coupled to the second input terminal.

9. The amplitude shift keying demodulator as claimed in claim 8, further comprising a bias circuit, the bias circuit comprising:
a first current source, wherein a terminal of the first current source is electrically coupled to a first supply voltage, and another terminal is electrically coupled to the gate electrode of the first N-type transistor;
a third N-type transistor having a gate electrode, a first source/drain electrode and a second source/drain electrode, wherein the gate electrode and the second source/drain electrode of the third N-type transistor both are electrically coupled to the gate electrode of the first N-type transistor, and the first source/drain electrode of the third N-type transistor is electrically coupled to a first bias voltage;
a second current source, wherein a terminal of the second current source is electrically coupled to a second supply voltage, and another terminal of the second current source is electrically coupled to the gate electrode of the first P-type transistor; and
a third P-type transistor having a gate electrode, a first source/drain electrode and a second source/drain electrode, wherein the gate electrode and the second source/drain electrode of the third P-type transistor both are electrically coupled to the gate electrode of the first P-type transistor, and the first source/drain electrode of the third P-type transistor is electrically coupled to the first bias voltage.

10. The amplitude shift keying demodulator as claimed in claim 8, wherein the current mirror circuit comprises:
a fourth P-type transistor having a gate electrode, a first source/drain electrode and a second source/drain electrode, wherein the gate electrode and the second source/drain electrode of the fourth P-type transistor both are electrically coupled to the second source/drain electrodes of the first and second N-type transistors, and the first source/drain electrode of the fourth P-type transistor is electrically coupled to a first supply voltage;
a fourth N-type transistor having a gate electrode, a first source/drain electrode and a second source/drain electrode, wherein the gate electrode and the second source/drain electrode of the fourth N-type transistor both are electrically coupled to the second source/drain electrodes of the first and second P-type transistors, and the first source/drain electrode of the fourth N-type transistor is electrically coupled to a second supply voltage;
a fifth P-type transistor having a gate electrode, a first source/drain electrode and a second source/drain electrode, wherein the gate electrode of the fifth P-type transistor is electrically coupled to the gate electrode of the fourth P-type transistor, the first source/drain electrode of the fifth P-type transistor is electrically coupled to the first supply voltage, and the second source/drain electrode of the fifth P-type transistor is electrically coupled to the output stage to provide the mirror current; and
a fifth N-type transistor having a gate electrode, a first source/drain electrode and a second source/drain electrode, wherein the gate electrode of the fifth N-type transistor is electrically coupled to the gate electrode of the fourth N-type transistor, the first source/drain electrode of the fifth N-type transistor is electrically coupled to the second supply voltage, and the second source/drain electrode of the fifth N-type transistor is electrically coupled to the output stage.

11. The amplitude shift keying demodulator as claimed in claim 10, wherein the output stage comprises:
a sixth P-type transistor having a gate electrode, a first source/drain electrode and a second source/drain electrode, wherein the first source/drain electrode of the sixth P-type transistor is electrically coupled to the first supply voltage;
a seventh P-type transistor having a gate electrode, a first source/drain electrode and a second source/drain electrode, wherein the first source/drain electrode of the seventh P-type transistor is electrically coupled to the first supply voltage, the gate electrode of the seventh P-type transistor is electrically coupled to the gate electrode of the sixth P-type transistor, and the second source/drain electrode of the seventh P-type transistor is electrically coupled to the second source/drain electrode of the fifth P-type transistor;
a eighth P-type transistor having a gate electrode, a first source/drain electrode and a second source/drain electrode, wherein the gate electrode of the eighth P-type transistor is electrically coupled to a second bias voltage, the first source/drain electrode of the eighth P-type transistor is electrically coupled to the second source/drain electrode of the sixth P-type transistor, and the second source/drain electrode of the eighth P-type transistor is electrically coupled to both of the gate electrode of the sixth P-type transistor and the second source/drain electrode of the fifth N-type transistor; and
a ninth P-type transistor having a gate electrode, a first source/drain electrode and a second source/drain electrode, wherein the gate electrode of the ninth P-type transistor is electrically coupled to the second bias voltage, the first source/drain electrode of the ninth P-type transistor is electrically coupled to the second source/drain electrode of the seventh P-type transistor, and the second source/drain electrode of the ninth P-type transistor is electrically coupled to the low pass filter to provide the output current.

12. A radio frequency identification system using the amplitude shift keying demodulator as claimed in claim 7, comprising:
- a wireless receiving module, adapted to receive a wireless radio frequency signal and transform the received wireless radio frequency signal into a corresponding alternating current input signal;
- the amplitude shift keying demodulator as claimed in claim 7, electrically coupled to the wireless receiving module to receive the alternating current input signal; and
- a processing module, electrically coupled to the amplitude shift keying demodulator to receive the demodulated envelope signal and adapted to perform a corresponding operation according to the demodulated envelope signal.

13. The radio frequency identification system as claimed in claim 12, further comprising a display module, wherein the display module is adapted to display the content contained in the demodulated envelope signal under the control of the processing module.

* * * * *